United States Patent
Mabutas et al.

(10) Patent No.: US 11,145,574 B2
(45) Date of Patent: Oct. 12, 2021

(54) SEMICONDUCTOR DEVICE PACKAGES WITH ELECTRICAL ROUTING IMPROVEMENTS AND RELATED METHODS

(71) Applicant: Microchip Technology Incorporated, Chandler, AZ (US)

(72) Inventors: Oliver Mabutas, Chachoengsao (TH); Ekgachai Kenganantanon, Chachoengsao (TH); Wichai Kovitsophon, Chachoengsao (TH); Tarapong Soontornvipart, Chachengsao (TH); Peerapat Bunkhem, Chacherngsao (TH)

(73) Assignee: Microchip Technology Incorporated, Chandler, AZ (US)

( * ) Notice: Subject to any disclaimer, the term of this patent is extended or adjusted under 35 U.S.C. 154(b) by 36 days.

(21) Appl. No.: 16/235,761

(22) Filed: Dec. 28, 2018

(65) Prior Publication Data
US 2020/0135620 A1    Apr. 30, 2020

Related U.S. Application Data

(60) Provisional application No. 62/752,777, filed on Oct. 30, 2018.

(51) Int. Cl.
*H01L 23/495* (2006.01)
*G01R 1/073* (2006.01)
(Continued)

(52) U.S. Cl.
CPC .... *H01L 23/49513* (2013.01); *G01R 1/07314* (2013.01); *H01L 21/56* (2013.01);
(Continued)

(58) Field of Classification Search
CPC ....... H01L 2924/00; H01L 2924/00014; H01L 2224/48247; H01L 24/48; H01L 2924/181;
(Continued)

(56) References Cited

U.S. PATENT DOCUMENTS

| 5,332,864 A | 7/1994 | Liang et al. |
| 5,455,387 A | 10/1995 | Hoffman et al. |

(Continued)

FOREIGN PATENT DOCUMENTS

CN    107104090 A    8/2017

OTHER PUBLICATIONS

International Search Report for International Application No. PCT/US2019/056358, dated Jan. 23, 2020, 4 pages.

(Continued)

*Primary Examiner* — Jonathan Han
(74) *Attorney, Agent, or Firm* — TraskBritt

(57) ABSTRACT

Semiconductor device packages may include a die-attach pad and a semiconductor die supported above the die-attach pad. A spacer comprising an electrically conductive material may be supported above the semiconductor die or between the semiconductor die and the die-attach pad. A wire bond may extend from a bond pad on an active surface of the semiconductor die to the spacer. Another wire bond may extend from the spacer to a lead finger or the die-attach pad. An encapsulant material may encapsulate the semiconductor die, the spacer, the wire bond, the other wire bond, the die-attach pad, and a portion of any lead fingers.

20 Claims, 11 Drawing Sheets

(51) Int. Cl.
    *H01L 21/66* (2006.01)
    *H01L 23/00* (2006.01)
    *H01L 23/31* (2006.01)
    *H01L 21/56* (2006.01)
(52) U.S. Cl.
    CPC .............. *H01L 22/12* (2013.01); *H01L 22/32* (2013.01); *H01L 23/3121* (2013.01); *H01L 23/4952* (2013.01); *H01L 24/09* (2013.01); *H01L 24/49* (2013.01)
(58) Field of Classification Search
    CPC . H01L 2224/73265; H01L 2224/32145; H01L 24/45; H01L 23/49565; H01L 23/3107; H01L 21/561; H01L 22/14; H01L 2224/2919; H01L 2224/32245; H01L 2224/33181; H01L 2224/48091; H01L 2224/4811; H01L 2224/48145; H01L 2224/48257; H01L 2224/4826; H01L 2224/49109; H01L 2224/49113; H01L 2224/49171; H01L 2224/49177; H01L 2224/73215; H01L 2224/83855; H01L 2224/92247; H01L 2224/97; H01L 2924/19107; H01L 23/49531; H01L 23/49513; H01L 22/32; H01L 22/12; H01L 24/49; H01L 23/3121; H01L 21/56; H01L 24/09; H01L 23/4952; H01L 24/32; H01L 24/33; H01L 24/73; H01L 24/83; H01L 24/85; H01L 24/92; H01L 2224/04042; H01L 2224/06165; G01R 1/07314; G01R 31/2893; G01R 31/2896

USPC ......... 438/106, 112, 109; 257/676, E23.031, 257/666, 686, 777
See application file for complete search history.

(56) References Cited

U.S. PATENT DOCUMENTS

| | | | |
|---|---|---|---|
| 5,497,032 | A | 3/1996 | Tsuji et al. |
| 5,780,926 | A | 7/1998 | Seo |
| 6,104,084 | A * | 8/2000 | Ishio ................. H01L 24/32 |
| | | | 257/666 |
| 6,603,072 | B1 | 8/2003 | Foster et al. |
| 6,686,651 | B1 | 2/2004 | Foster |
| 8,987,053 | B2 * | 3/2015 | Upadhyayula ........ H01L 21/561 |
| | | | 438/107 |
| 9,190,352 | B2 * | 11/2015 | Tiu .................. H01L 23/49551 |
| 9,490,222 | B1 * | 11/2016 | Awujoola .......... H01L 23/49811 |
| 10,043,721 | B2 | 8/2018 | Taguchi |
| 2007/0164411 | A1 | 7/2007 | Huang et al. |
| 2013/0249106 | A1 | 9/2013 | Lin et al. |
| 2014/0225258 | A1 | 8/2014 | Chiu et al. |
| 2014/0374848 | A1 * | 12/2014 | Koh ...................... H01L 24/97 |
| | | | 257/415 |
| 2016/0035622 | A1 | 2/2016 | Kumar et al. |
| 2017/0125881 | A1 | 5/2017 | Mangrum et al. |
| 2017/0330822 | A1 | 11/2017 | Chang et al. |

OTHER PUBLICATIONS

International Written Opinion for International Application No. PCT/US2019/056358, dated Jan. 23, 2020, 11 pages.

* cited by examiner

SEMICONDUCTOR DEVICE PACKAGES WITH ELECTRICAL ROUTING IMPROVEMENTS AND RELATED METHODS

CROSS-REFERENCE TO RELATED APPLICATION

This application claims the benefit under 35 U.S.C. § 119(e) of U.S. Provisional Patent Application Ser. No. 62/752,777, filed Oct. 30, 2018, the disclosure of which is hereby incorporated herein in its entirety by this reference.

FIELD

This disclosure relates generally to methods of fabricating semiconductor device packages. More specifically, disclosed embodiments relate to techniques for forming electrical connections within semiconductor device packages that may enable electrical connections to be made utilizing wire bonding techniques in small spaces and at fine pitches, enable strip testing of semiconductor device packages on lead frames, reduce undesirable shorts between electrical connections, and do so without requiring significant retooling or redesign of start and end locations for electrical connections.

BACKGROUND

When fabricating semiconductor device packages, semiconductor dice may be supported on respective die-attach pads of lead frames interconnected to one another in a strip. Wire bonds may be formed in such a way that the wire bonds extend from bond pads on active surfaces of the semiconductor dice to lead fingers of the respective lead frames. One or more wire bonds may also be formed in such a way that the wire bonds extend from bond pads of the semiconductor dice to the respective die-attach pads of the lead frames, and from the respective die-attach pads of the lead frames to other lead fingers. Each respective semiconductor die, with its associated die-attach pad, wire bonds, and portions of lead fingers may be encapsulated in a dielectric encapsulant material. The die-attach pad and lead fingers may be separated from the strip, and the semiconductor device package may be removed. The individual semiconductor device packages may be tested, one at a time, by contacting testing probes to the lead fingers, sending test signals through some of the test probes, and measuring the response of the respective semiconductor device package via at least another of the probes.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device package, intermediate product in a process, or component thereof, but are merely idealized representations employed to describe illustrative embodiments. Thus, the drawings are not necessarily to scale.

Disclosed embodiments relate generally to techniques for forming electrical connections within semiconductor device packages that may enable electrical connections to be made utilizing wire bonding techniques in small spaces and at fine pitches, enable strip testing of semiconductor device packages on lead frames, reduce undesirable shorts between electrical connections, and do so without requiring significant retooling or redesign of start and end locations for electrical connections. More specifically, disclosed are embodiments of semiconductor device packages that may include spacers located on one or more surfaces of associated semiconductor dice, which may enable wire bonds extending from bond pads on active surfaces of the semiconductor dice to connect to the spacers, and other wire bonds extending from the spacers to connect to other structures to provide unconventional electrical routing.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

As used herein, spatially relative terms, such as "upper," "lower," "bottom," and "top," are for ease of description in identifying one element's relationship to another element, as illustrated in the figures. Unless otherwise specified, the spatially relative terms are intended to encompass different orientations of the materials in addition to the orientation depicted in the figures. Thus, the term "upper" can encompass elements above, below, to the left of, or to the right of other elements, depending on the orientation of a device. The materials may be otherwise oriented (rotated ninety degrees, inverted, etc.) and the spatially relative descriptors used herein interpreted accordingly.

Figure 1:
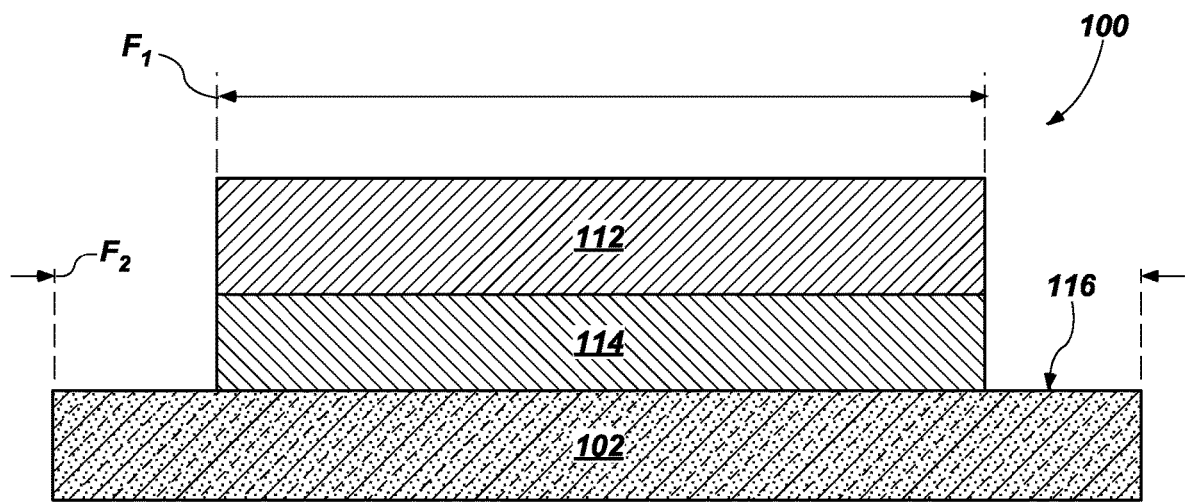
FIG. 1 is a cross-sectional side view of a first intermediate product in a first stage of making and testing semiconductor device packages.

FIG. 1 is a cross-sectional side view of a first intermediate product 100 in a first stage of making and testing semiconductor device packages. The first intermediate product 100 may include a die-attach pad 102. With combined reference to FIGS. 1 and 5, the die-attach pad 102 may be provided as a component of a lead frame 104 in a strip 106 supporting a group of the lead frames 104. More specifically, the die-attach pad 102 shown in FIG. 1 may be one in an array of die-attach pads 102 supported on a frame 108 of the strip 106 by support tabs or tie bars 110 extending from the die-attach pad 102 to the frame 108. Providing the die-attach pads 102 as an array in the strip 106 may particularly suit the methods of fabricating disclosed herein for bulk processing of semiconductor device packages.

A spacer 112 may be supported on the die-attach pad 102. More specifically, a spacer 112 may be supported on each die-attach pad 102 of at least some die-attach pads 102 in the array. As a specific, nonlimiting example, a spacer 112 may be supported on each die-attach pad 102 in the array. A dielectric material 114 may be interposed between a respective spacer 112 and its associated die-attach pad 102. For example, quantities of the dielectric material 114 may be placed on the relevant die-attach pads 102 and may be used to secure the spacers 112 to the associated die-attach pads 102. More specifically, masses of the dielectric material 114 may be dispensed onto each of the die-attach pads 102, and individual spacers 112 may be contacted to associated masses of the dielectric material 114 one at a time in a pick-and-place operation. In embodiments where the dielectric material 114 may require curing, the dielectric material 114 may be cured to secure the spacer 112 to the die-attach pad 102 (e.g., by heating and then cooling). The dielectric material 114 may include, for example, a polymer material. More specifically, the dielectric material 114 may include, for example, an epoxy material. The dielectric material 114 may electrically isolate the spacer 112 from the die-attach pad 102.

The spacer 112 may include an electrically conductive material. For example, the spacer 112 may include a mass of an electrically conductive material capable of forming connections utilizing a wire bonding process. More specifically, the spacer 112 may include a plate, sheet, foil, or block of a metal or metal alloy material. As a specific, nonlimiting example, the spacer 112 may include a rectangular prism composed of an aluminum, aluminum-alloy, copper, copper alloy, gold, or gold-alloy material.

A first footprint $F_1$ of the spacer 112, as projected in a direction perpendicular to an upper surface 116 of the die-attach pad 102 on which the spacer 112 is supported, may be less than or equal to a second footprint $F_2$ of the die-attach pad 102, as projected in the same direction. More specifically, the first footprint $F_1$ of the spacer 112 may be less than the second footprint $F_2$ of the die-attach pad 102, such that a portion of the upper surface 116 may be exposed laterally beyond a periphery of the spacer 112.

Figure 2:
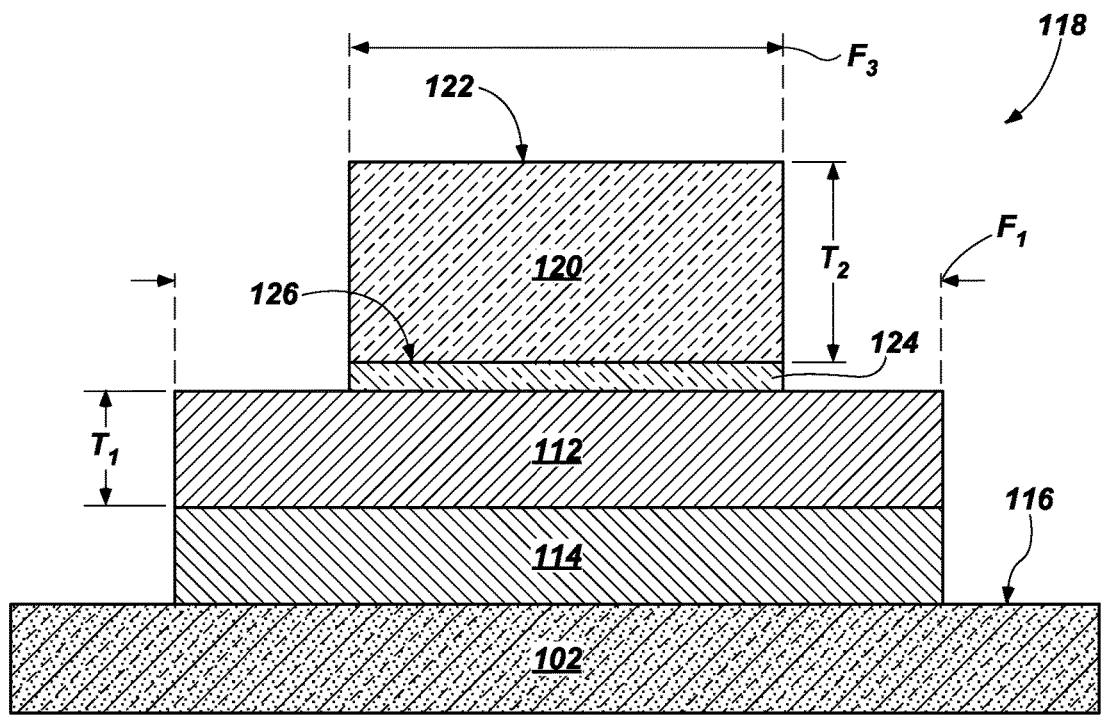
FIG. 2 is a cross-sectional side view of a second intermediate product in a second stage of making and testing the semiconductor device packages.

FIG. 2 is a cross-sectional side view of a second intermediate product 118 in a second stage of making and testing the semiconductor device packages. At the second stage, a semiconductor die 120 may be supported on the spacer 112. More specifically, a semiconductor die 120 may be supported on each spacer 112 of at least some spacers 112 in the array. As a specific, nonlimiting example, a semiconductor die 120 may be supported on each spacer 112 in the array. The semiconductor die 120 may include an active surface 122 having integrated circuitry embedded therein and/or thereon. The active surface 122 may be located on a side of the semiconductor die 120 opposite the spacer 112.

A dielectric material 124 may be interposed between a respective spacer 112 and its associated semiconductor die 120. For example, quantities of the dielectric material 124 may be placed on the relevant spacers 112 and may optionally be used to secure the respective semiconductor dice 120 to the associated spacers 112. More specifically, masses of the dielectric material 124 may be dispensed onto each of the spacers 112, and individual semiconductor dice 120 may be contacted to associated masses of the dielectric material 124 one at a time in a pick-and-place operation. In embodiments where the dielectric material 124 may require curing, the dielectric material 124 may be cured to secure the spacer 112 to the associated semiconductor die 120 (e.g., by heating and then cooling). The dielectric material 124 may include, for example, a polymer material. More specifically, the dielectric material 124 may include, for example, an epoxy material. As specific, nonlimiting examples, the dielectric material 124 may include epoxy, epoxy resin, or other polyepoxides, prepolymers, or polymers containing epoxide groups. The dielectric material 124 may be the same as, or different from, the dielectric material 114 located between the spacer 112 and the die-attach pad 102. The dielectric material 124 may electrically isolate the spacer 112 from the semiconductor material of the semiconductor die 120 at an inactive surface 126 of the semiconductor die 120, the inactive surface 126 located on a side of the semiconductor die 120 opposite the active surface 122.

The spacer 112 may be relatively thin to keep a total thickness of the semiconductor device package within acceptable limits. A first thickness $T_1$ of the spacer 112, as measured in a direction perpendicular to the active surface 122 of the semiconductor die 120, may be, for example, less than, equal to, or greater than a second thickness $T_2$ of the semiconductor die 120 itself. The first thickness $T_1$ of the spacer 112 may be, for example, about 15 thousandths of an inch or less. More specifically, the first thickness $T_1$ of the spacer 112 may be, for example, between about 5 thousandths of an inch and about 10 thousandths of an inch. As a specific, nonlimiting example, the first thickness $T_1$ of the spacer 112 may be about 8 thousandths of an inch.

The first footprint $F_1$ of the spacer 112, as projected in a direction perpendicular to the active surface 122 of the semiconductor die 120, may be greater than a third footprint $F_3$ of the semiconductor die 120, as projected in the same direction. More specifically, the first footprint $F_1$ of the spacer 112 may be greater than the third footprint $F_3$ of the semiconductor die 120, such that a portion of the spacer 122 may be exposed laterally beyond a periphery of the semiconductor die 120.

Figure 3:
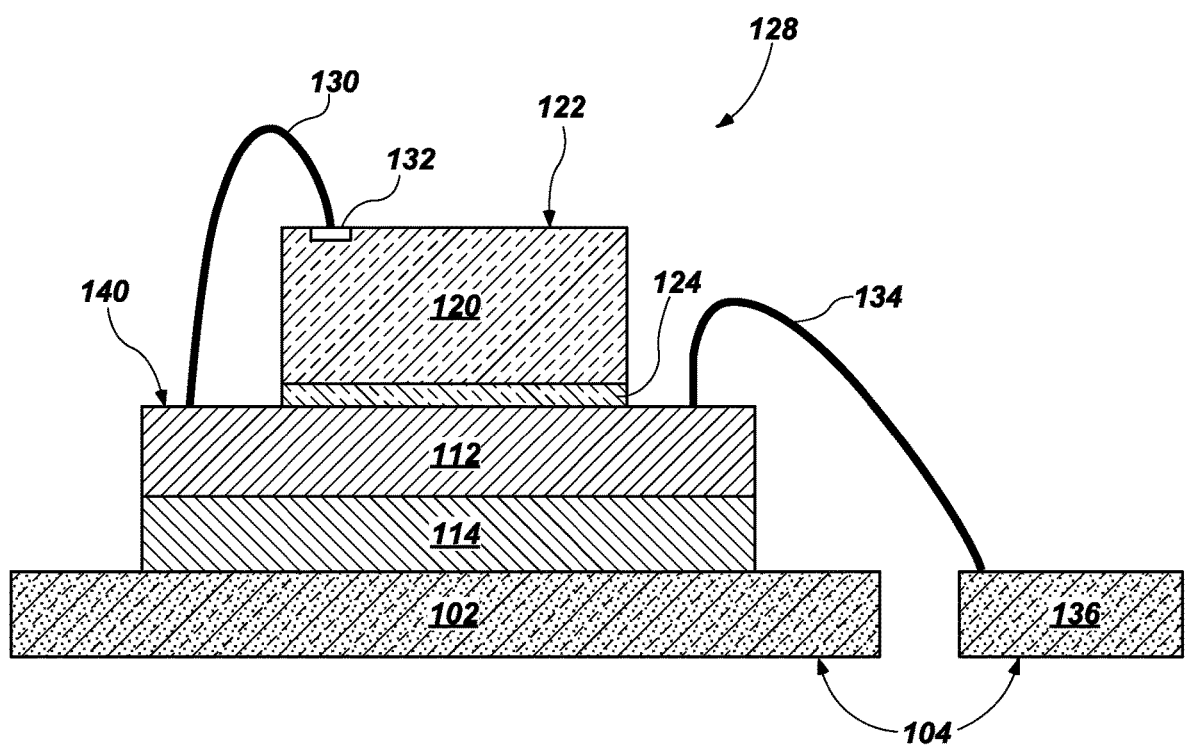
FIG. 3 is a cross-sectional side view of a third intermediate product in a third stage of making and testing the semiconductor device packages.

FIG. 3 is a cross-sectional side view of a third intermediate product 128 in a third stage of making and testing the semiconductor device packages. During the third stage, electrical connections to the semiconductor die 120 may be formed using wire bonding techniques. For at least one connection, a first wire bond 130 extending from a bond pad 132 on the active surface 122 of each respective semiconductor die 120 to the associated spacer 112 may be formed.

A second wire bond 134 extending from each respective spacer 112 to an associated lead finger 136 of the respective lead frame 104 may also be formed. The spacer 112, first wire bond 130, and second wire bond 134 may collectively enable an operative, electrical connection to be formed between the relevant lead finger 136 and the bond pad 132 of the semiconductor die 120 without forming an electrical connection to the die-attach pad 102, without redesigning the position of the bond pad 132 or the orientation of the semiconductor die 120, and without requiring custom design for the die-attach pad 102 and lead fingers 136.

Figure 4:
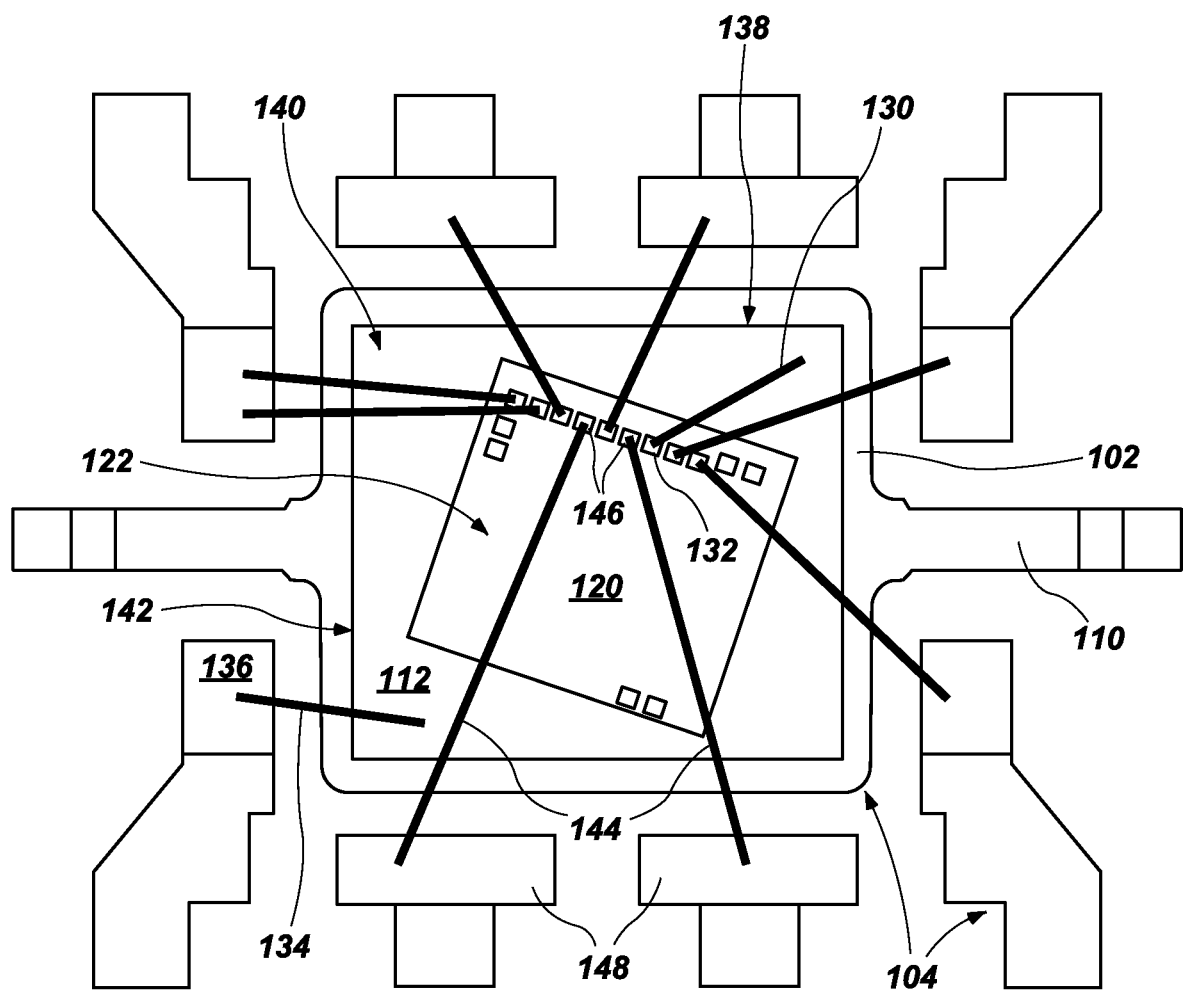
FIG. 4 is a top view of the third intermediate product of FIG. 3.

FIG. 4 is a top view of the third intermediate product 128 of FIG. 3. The first wire bond 130 may extend from the bond pad 132 toward a first lateral side 138 of the spacer 112, and the second wire bond 134 may extend from an exposed surface 140 of the spacer 112 toward a second, different lateral side 142 of the spacer 112. The bond pad 132 may be located distal from the lead finger 136 to which it is intended to be electrically and operatively connected. Rather than forming a long wire bond that may cross over or under paths of other wire bonds 144, increasing the risk of unintentional shorts between the wire bonds 130 and 144, the spacer 112, first wire bond 130, and second wire bond 134 may enable use of shorter wire bonds 130 and 144 and route signals from the bond pad 132 to the first wire bond 130, underneath the semiconductor die 120 via the spacer 112, to the second wire bond 134 and the lead finger 136. The first and second wire bonds 130 and 134 and the spacer 112 may be particularly suitable for forming electrical connections from the bond pads 132 to electrical ground. The other wire bonds 144 may also be formed during the third stage, and may extend from other bond pads 146 on the active surface 122 of the semiconductor die 120 to other lead fingers 148 of the lead frame 104.

Figure 5:
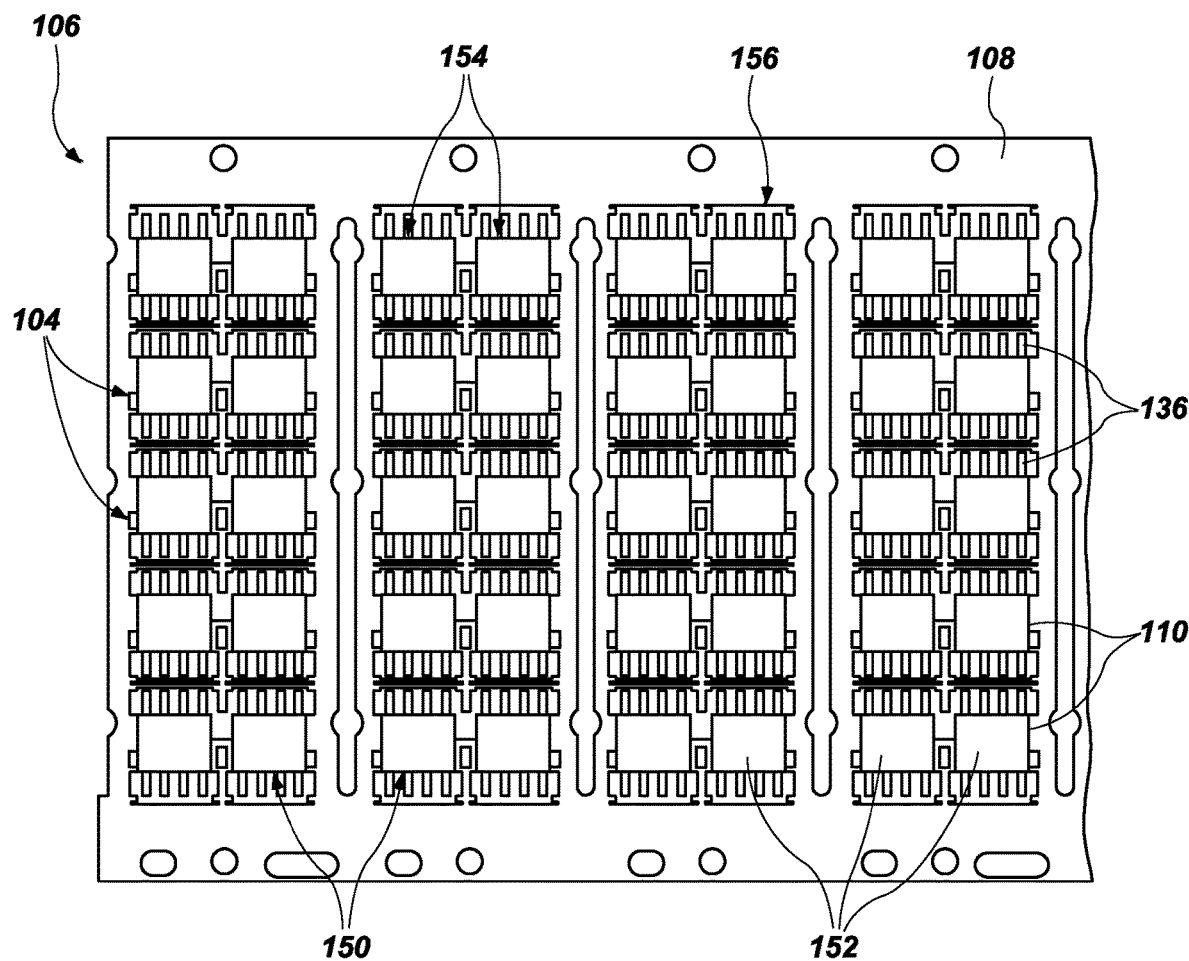
FIG. 5 is a top view of a fourth intermediate product in a fourth stage of making and testing the semiconductor device packages.

FIG. 5 is a top view of a fourth intermediate product 150 in a fourth stage of making and testing the semiconductor device packages. Respective masses of an encapsulant material 152 may be provided to encapsulate each semiconductor die 120 and associated spacer 112, wire bonds 130, 134, and 144, die-attach pad 102, and portions of lead fingers 136 and 148 to form respective semiconductor device packages 154 during the fourth stage. During the encapsulation process, wire bonds 130, 134, and 144 may have a tendency to deform (e.g., sweep) in response to flow of the encapsulant material 152 in an uncured state over and around the wire bonds 130, 134, and 144. This deformation may cause long and/or close wire bonds to make contact with one another, or may cause wire bonds to become detached, resulting in a potentially inoperative semiconductor device package. Using the spacer 112, first wire bond 130, and second wire bond 134 may reduce the risk of such a failure occurring.

Figure 6:
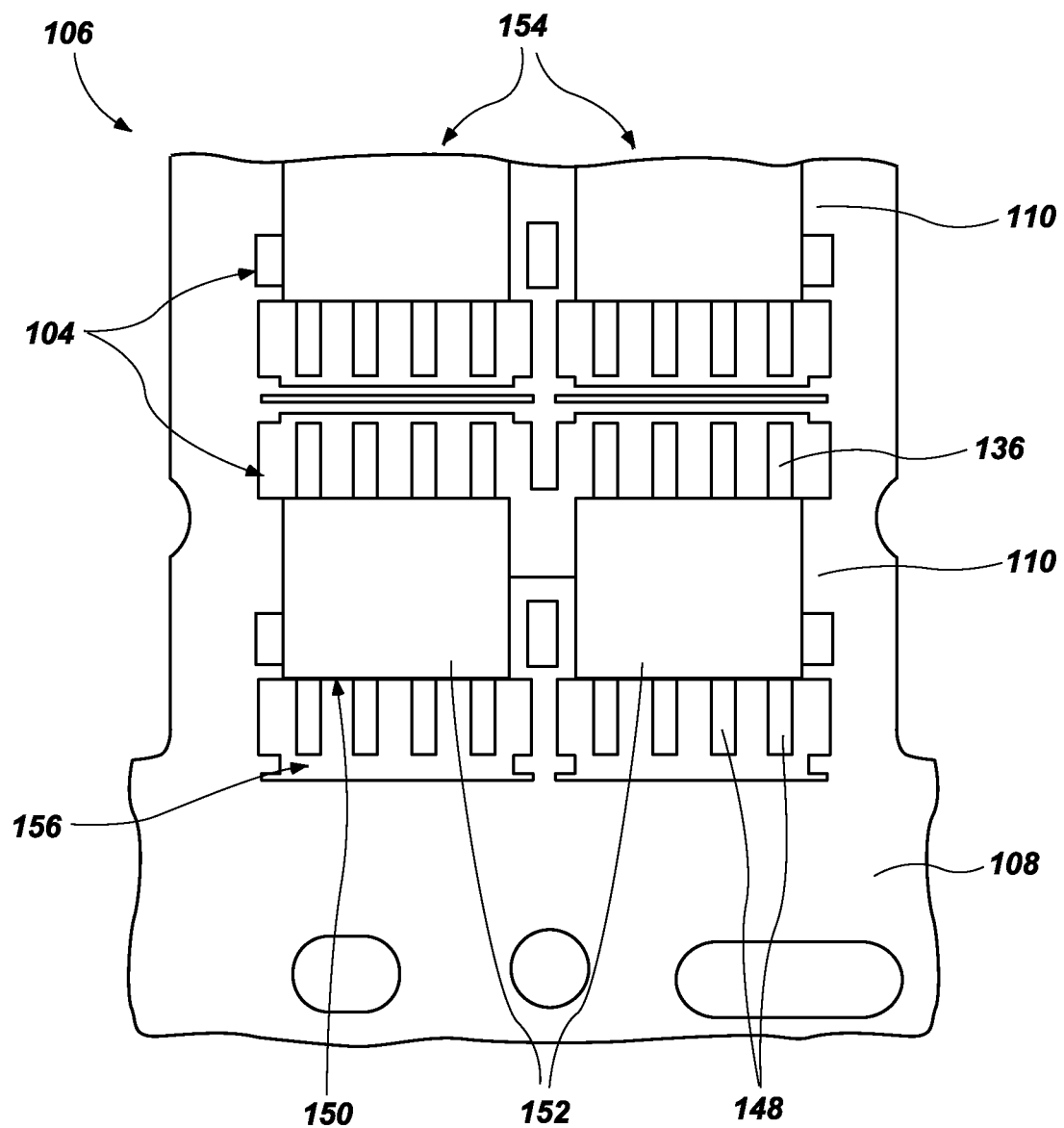
FIG. 6 is an enlarged top view of the fourth intermediate product of FIG. 5.

FIG. 6 is an enlarged top view of the fourth intermediate product 150 of FIG. 5. During the fourth stage, the lead fingers 136 and 148 may be detached from the frame 108. For example, a saw may be used to cut through portions of the lead fingers 136 and 148 distal from the encapsulant material 152 and proximate to the frame 108. A space 156 may be located between the distal ends of the lead fingers 136 and 148 and the frame 108. Detachment may electrically and operationally isolate individual lead fingers 136 and 148 from the frame 108. The die-attach pad 102 may be free of operative connections to any lead finger 136 and 148, and the die-attach pad 102 may be free of electrical connections to the semiconductor die 120. The die-attach pad 102 may remain supported on the frame 108 of the strip 106 by the support tie bars 110 extending laterally from the die-attach pad 102 to the frame 108. The die-attach pad 102 may be electrically and operatively connected to the frame 108 via the support tie bars 110. The spacer 112 and the semiconductor die 120 may be electrically isolated from the frame 108 and from the die-attach pad 102 at least by the masses of dielectric material 114 and 124 located therebetween.

The semiconductor device packages 154 may be subjected to testing, and particularly bulk, strip testing, while the die-attach pads 102 remain supported on the frame 108 by the support tie bars 110. For example, a probe unit including an array of probes may be brought into proximity with the strip 106, and the array of probes may be placed in contact with the lead fingers 136 and 148, with each lead finger 136 being contacted by an individual probe. Test signals may be sent from, and received at, various ones of the probes to test the responses of the semiconductor device packages 154. Because none of the lead fingers 136 and 148 is operatively connected to the die-attach pad 102 by a wire bond, no confusing or duplicate signals may be transmitted across various semiconductor device packages 154 and into the probes via interconnection from the lead fingers 136 and 148, a wire bond, the die-attach pad 102, the support tie bars 110, and the frame 108. As a result, the spacer 112 may enable strip testing of the semiconductor device packages 154.

Following testing, the semiconductor device packages 154 may be separated from the frame 108 by severing the tie bars 110. For example, a saw may be used to cut through portions of tie bars 110 proximate to the encapsulant material 152 and distal from the frame 108. Those semiconductor device packages 154 confirmed to be operable through the testing may be sorted for sale, and those semiconductor device packages 154 identified as malfunctioning or inoperable may be sorted out for further analysis.

Figure 7:
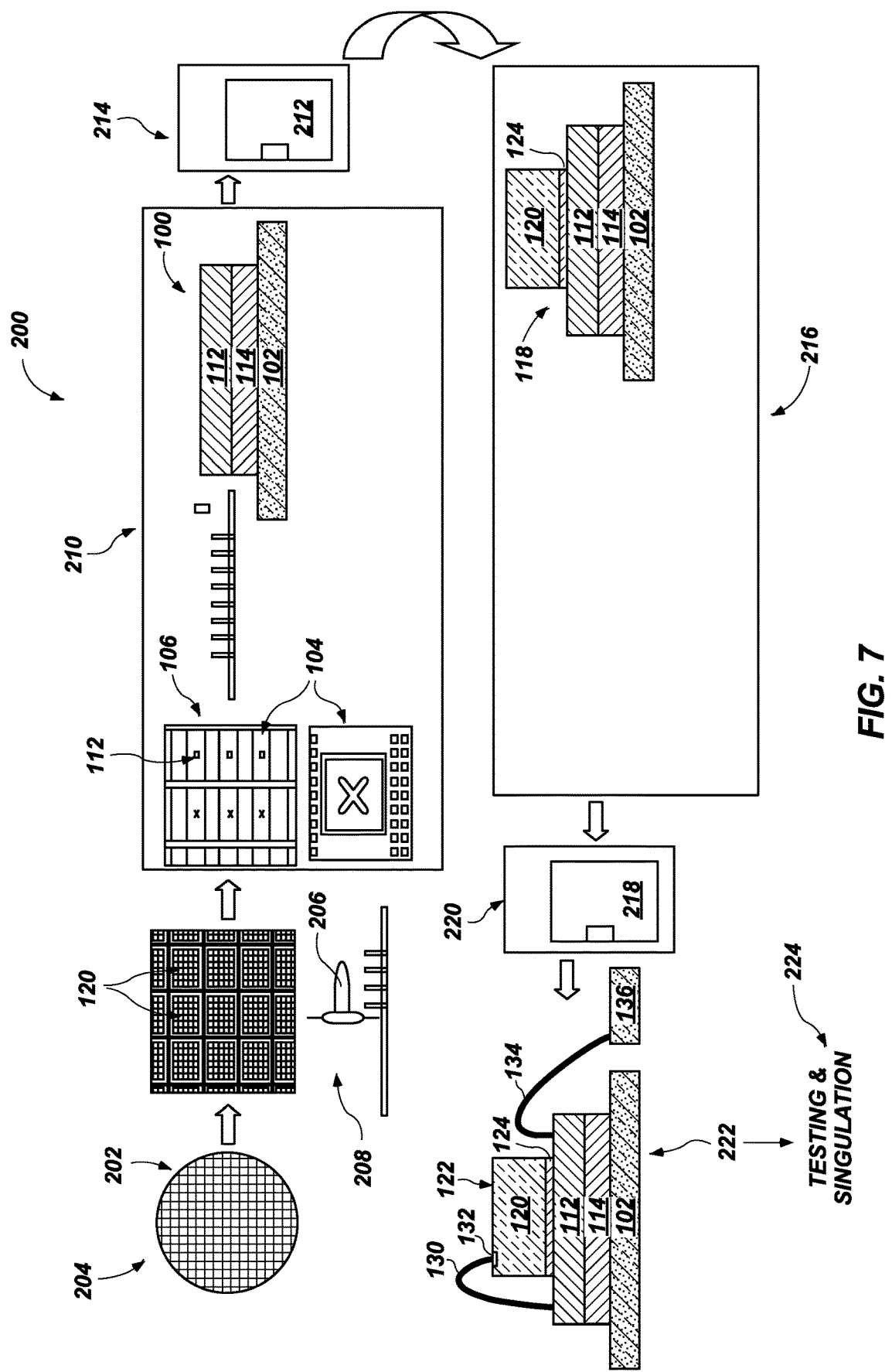
FIG. 7 is a simplified schematic process flow of a more complete process of making and testing semiconductor device packages generally in accordance with FIGS. 1 through 6.

FIG. 7 is a simplified schematic process flow 200 of a more complete description of a process of making and testing semiconductor device packages generally in accordance with FIGS. 1 through 6. The process flow 200 may involve providing a wafer 202 of semiconductor material, the wafer 202 including many semiconductor dice 120, for example, in a grid array across the wafer 202, as indicated at act 204. Individual semiconductor dice 120 may be singulated from one another using, for example, a dicing saw 206, as indicated at act 208. A strip 106 of lead frames 104 may be provided, and individual masses of dielectric material 114 may be placed on the respective die-attach pads 102 of the lead frames 104, as indicated at act 210 and described in greater detail in connection with FIG. 1. Individual spacers 112 may be placed on the respective masses of dielectric material 114 with the respective die-attach pads 102 located on sides of the masses of dielectric material 114 opposite the spacers 112, as also indicated at act 210 and described in greater detail in connection with FIG. 1. The masses of dielectric material 114 may be cured, such as, for example, by heating in a furnace 212, to secure the spacers 112 to the respective die-attach pads 102, as indicated at act 214.

Other individual masses of dielectric material 124 may be placed on the respective spacers 112 on a side opposite the die-attach pads 102, as indicated at act 216 and described in greater detail in connection with FIG. 2. Individual semiconductor dice 120 may be placed on the respective masses of dielectric material 124 with the masses of dielectric material 124 located between the spacers 112 and the semiconductor dice 120, as also indicated at act 216 and described in greater detail in connection with FIG. 2. The masses of dielectric material 124 may be cured, such as, for example, by heating in a furnace 218 (e.g., the same or a different furnace to the previously used furnace 212), to secure the semiconductor dice 120 to the respective spacers 112, as indicated at act 220.

After any curing, the individual first wire bonds 130 extending from respective bond pads 132 on the active surfaces 122 of each respective semiconductor die 120 to the associated spacer 112 may be formed. Individual second wire bonds 134 extending from each respective spacer 112 to associated lead fingers 136 of the respective lead frames 104 may also be formed, as indicated at act 222, and described in greater detail in connection with FIGS. 3 and 4. Finally, encapsulation, testing, and final singulation of completed semiconductor device packages may take place, as indicated at act 224 and described in greater detail in connection with FIGS. 5 and 6.

Figure 8:
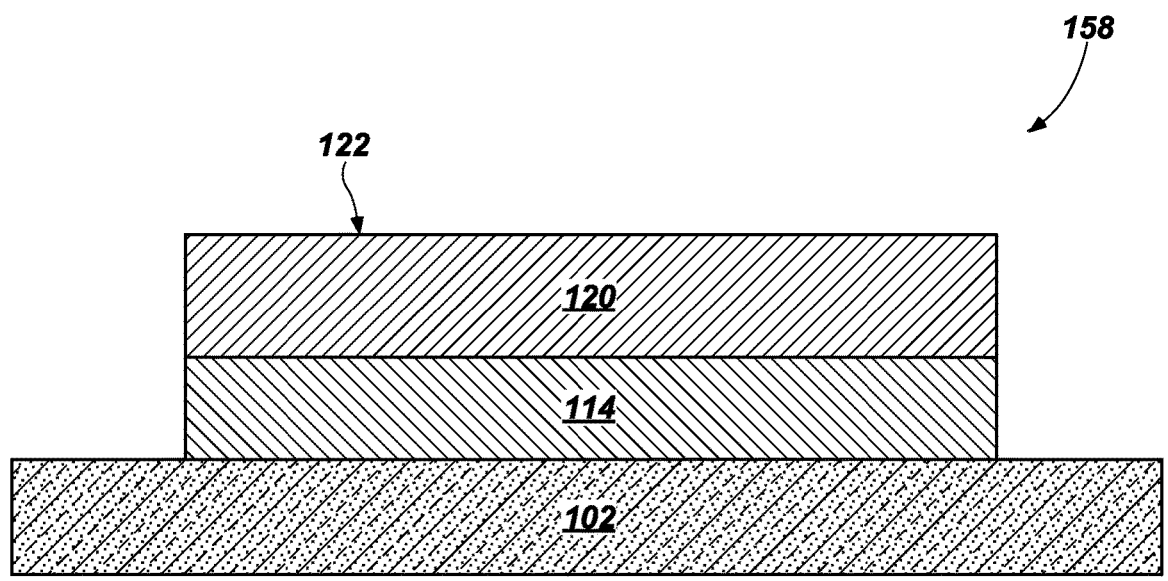
FIG. 8 is a cross-sectional side view of another first intermediate product in a first stage of another process of making a semiconductor device package.

FIG. 8 is a cross-sectional side view of another first intermediate product 158 in a first stage of another process of making a semiconductor device package. The first intermediate product 158 may include a die-attach pad 102. A semiconductor die 120 may be supported on the die-attach pad 102. The semiconductor die 120 may include an active surface 122 having integrated circuitry embedded therein and/or thereon. The active surface 122 may be located on a side of the semiconductor die 120 opposite the die-attach pad 102. A dielectric material 114 may be interposed between the semiconductor die 120 and the die-attach pad 102. For example, a quantity of the dielectric material 114 may be placed on the relevant die-attach pads 102 and may be used to secure the semiconductor die 120 to the die-attach pad 102. More specifically, a mass of the dielectric material 114 may be dispensed onto the die-attach pad 102, and the semiconductor die 120 may be contacted to the mass of the dielectric material 114 in a pick-and-place operation. In embodiments where the dielectric material 114 may require curing, the dielectric material 114 may be cured to secure the semiconductor die 120 to the die-attach pad 102 (e.g., by heating and then cooling). The dielectric material 114 may include, for example, any of the materials described previously in connection with FIG. 1. The dielectric material 114 may electrically isolate the semiconductor die 120 from the die-attach pad 102.

Figure 9:
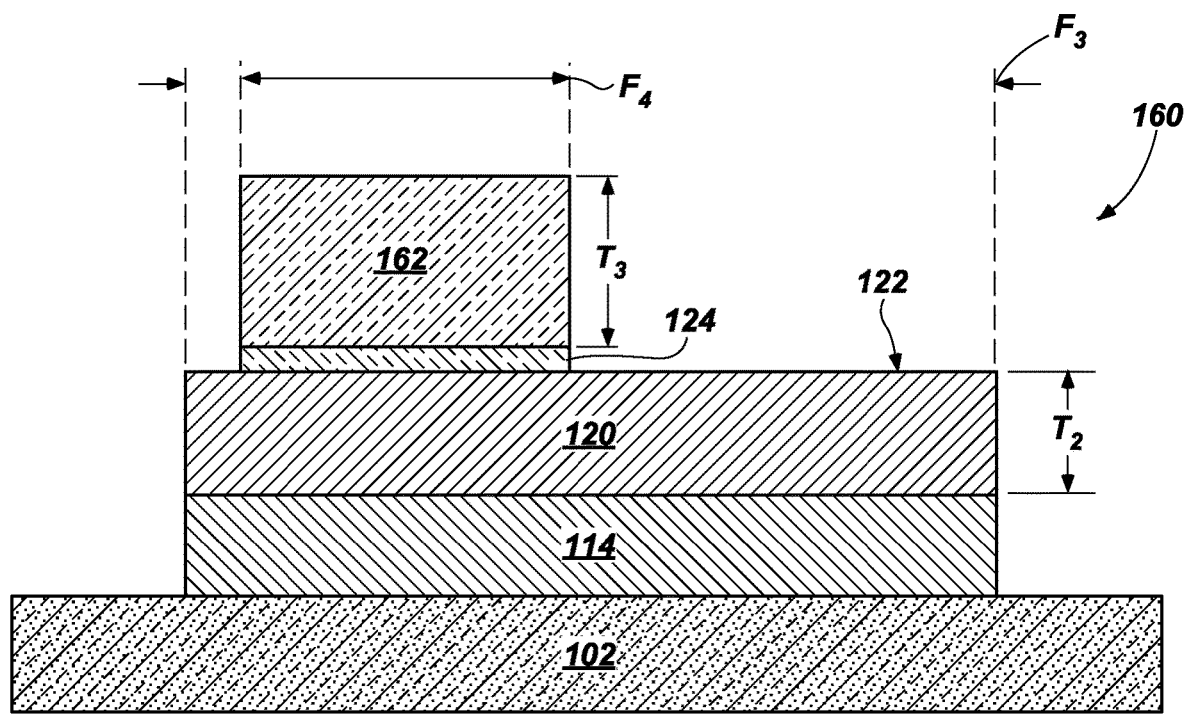
FIG. 9 is a cross-sectional side view of another second intermediate product in a second stage of the other process of making a semiconductor device package.

FIG. 9 is a cross-sectional side view of another second intermediate product 160 in a second stage of the other process of making a semiconductor device package. At the second stage, a spacer 162 may be supported on the semiconductor die 120. More specifically, a spacer 162 may be supported on the active surface 122 of the semiconductor die 120, on a side of the semiconductor die 120 opposite the die-attach pad 102, such that the semiconductor die 120 may be interposed between the die-attach pad 102 and the spacer 162.

A dielectric material 124 may be interposed between the spacer 162 and the semiconductor die 120. For example, a quantity of the dielectric material 124 may be placed on the semiconductor die 120 and may optionally be used to secure the spacer 162 to the semiconductor die 120. More specifically, a mass of the dielectric material 124 may be dispensed onto the active surface 122 of the semiconductor die 120, and the spacer 162 may be contacted to the mass of the dielectric material 124 in a pick-and-place operation. In embodiments where the dielectric material 124 may require curing, the dielectric material 124 may be cured to secure the spacer 162 to the semiconductor die 120 (e.g., by heating and then cooling). The dielectric material 124 may include, for example, any of those materials discussed previously in connection with FIG. 2. The dielectric material 124 may be the same as, or different from, the dielectric material 114 located between the semiconductor die 120 and the die-attach pad 102. The dielectric material 124 may electrically isolate the spacer 162 from the semiconductor material of the semiconductor die 120 at the active surface 122 of the semiconductor die 120.

The spacer 162 may be relatively thin to keep a total thickness of the semiconductor device package within acceptable limits. A third thickness $T_3$ of the spacer 162, as measured in a direction perpendicular to the active surface 122 of the semiconductor die 120, may be, for example, less than, equal to, or greater than a second thickness $T_2$ of the semiconductor die 120 itself. The third thickness $T_3$ of the spacer 162 may be, for example, about 15 thousandths of an inch or less. More specifically, the third thickness $T_3$ of the spacer 162 may be, for example, between about 5 thousandths of an inch and about 10 thousandths of an inch. As a specific, nonlimiting example, the third thickness $T_3$ of the spacer 162 may be about 8 thousandths of an inch.

A fourth footprint $F_4$ of the spacer 162, as projected in a direction perpendicular to the active surface 122 of the semiconductor die 120, may be less than or equal to a third footprint $F_3$ of the semiconductor die 120, as projected in the same direction. More specifically, the fourth footprint $F_4$ of the spacer 162 may be less than the third footprint $F_3$ of the semiconductor die 120, such that a portion of the active surface 122 of the semiconductor die 120 may be exposed laterally beyond a periphery of the spacer 162. In embodiments where the fourth footprint $F_4$ of the spacer 162 is equal to the third footprint $F_3$ of the semiconductor die 120, the spacer 162 may include holes or cutouts to grant access to bond pads on the active surface 122.

Figure 10:
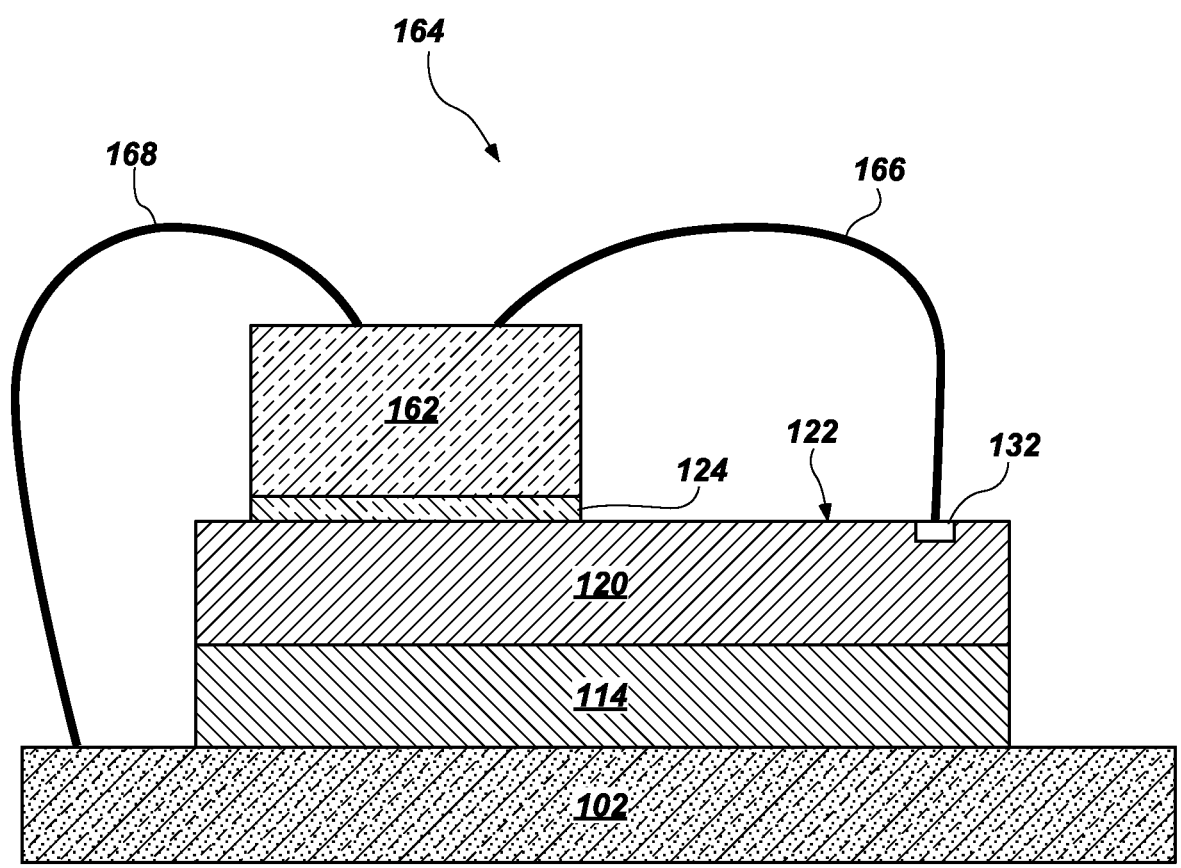
FIG. 10 is a cross-sectional side view of another third intermediate product in a third stage of the other process of making a semiconductor device package.

FIG. 10 is a cross-sectional side view of another third intermediate product 164 in a third stage of the other process of making a semiconductor device package. During the third stage, electrical connections to the semiconductor die 120 may be formed using wire bonding techniques. For at least one connection, a first wire bond 166 extending from a bond pad 132 on the active surface 122 of the semiconductor die 120 to the spacer 162 may be formed. A second wire bond 168 extending from the spacer 162 to the die-attach pad 102 may also be formed. The spacer 162, first wire bond 166, and second wire bond 168 may collectively enable an operative, electrical connection to be formed between the die-attach pad 102 and the bond pad 132 of the semiconductor die 120 without running the first wire bonds 166 from locations on the active surface where many bond pads are located close to one another in the same direction as the other wire bonds extending from those bond pads.

Figure 11:
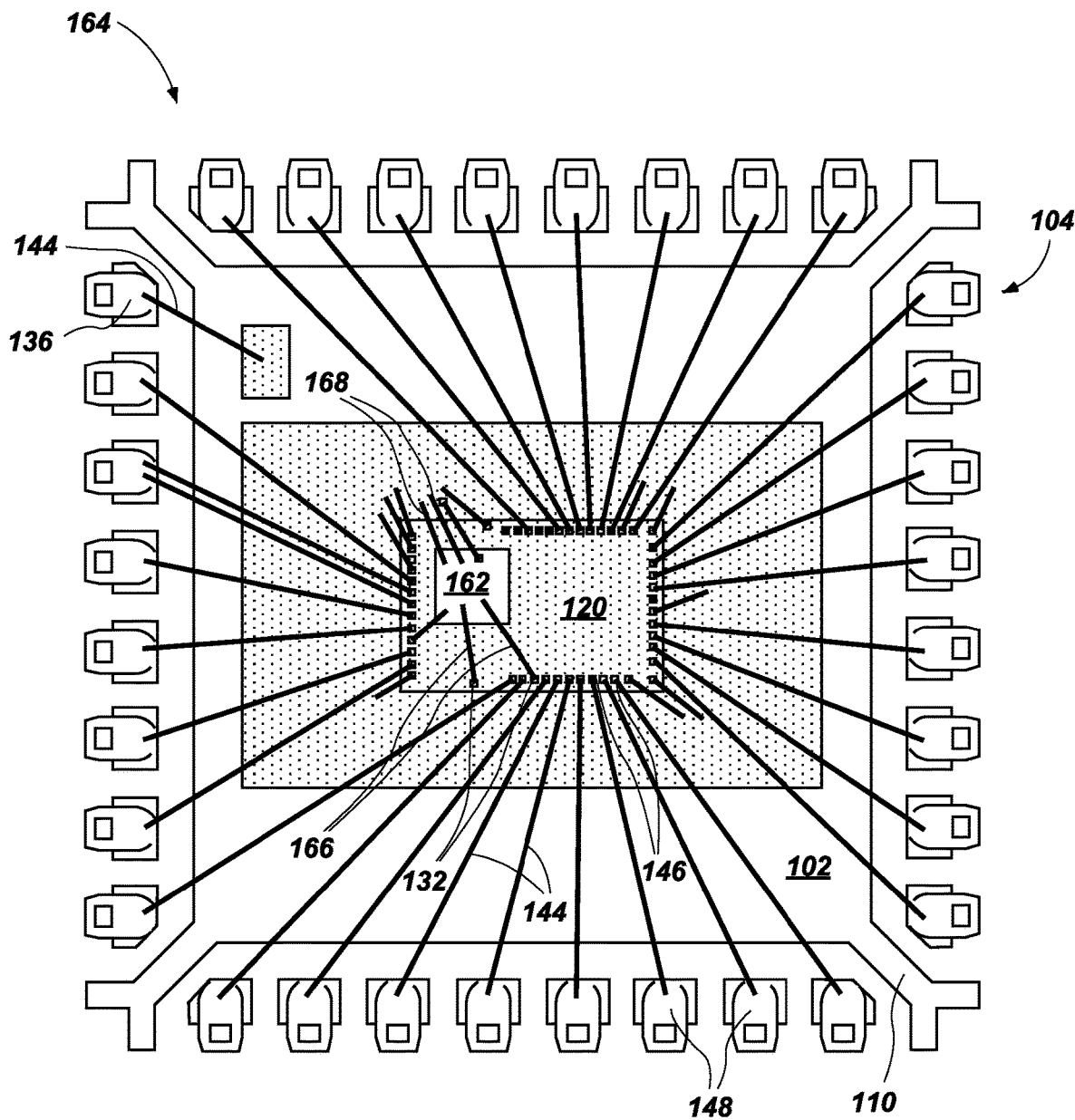
FIG. 11 is a top view of the other third intermediate product of FIG. 10.

FIG. 11 is a top view of the other third intermediate product 164 of FIG. 10. As shown in FIG. 11, several of the first wire bonds 166 and second wire bonds 168 may be formed within the same semiconductor device package. The first wire bonds 166 may extend from bond pads 132 where there is a high concentration of the bond pads 132 and other bond pads 146, requiring a high concentration (e.g., a fine pitch) of the first wire bonds 166 and other wire bonds 144. If the first wire bonds 166 and the other wire bonds 144 were to be routed in directions such that they remained in close proximity over a majority or entirety of their lengths, their tendency to deform during encapsulation would increase the likelihood of shorting adjacent wire bonds 166 and 144 to one another. The spacer 162 may enable the first wire bonds 166 to extend from the bond pads 132 in directions other than toward the closest periphery of the semiconductor die 120. The spacer 162 may be located in a position enabling the first wire bonds 166 to extend from a region of the semiconductor die 120 with a first, high number of wire bonds 144 and 166 per unit area toward a region of the semiconductor die 120 having a second, lower number of wire bonds 144 and 166 per unit area. The second wire bonds 168 may extend from the spacer 162 beyond a region of the semiconductor die 120 having a low number of wire bonds 144 and 168 to the die-attach pad 102. The first and second wire bonds 166 and 168 and the spacer 162 may be particularly suitable for forming electrical connections from the bond pads 132 to electrical ground. Other wire bonds 144 may also be formed to extend from other bond pads 146 directly to lead fingers 148, or from the die-attach pad 102 to a lead finger 136.

Following the formation of wire bonds 144, 166, and 168, the third intermediate product 164 may be subjected to further processing, including encapsulation and separation from any frame 108 or strip, as discussed previously in connection with FIGS. 5 and 6.

Figure 12:
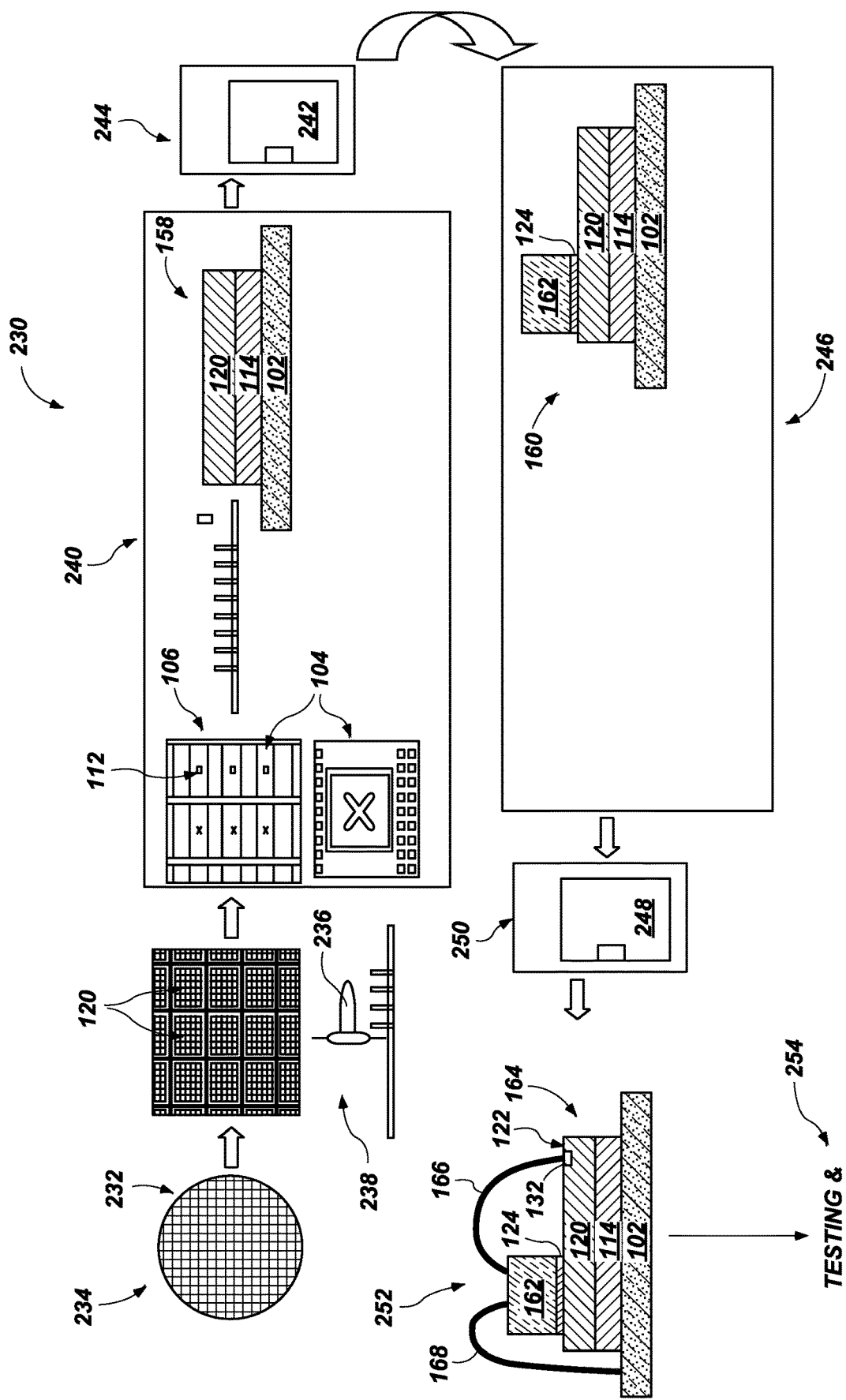
FIG. 12 is a simplified schematic process flow of a more complete process of making a semiconductor device package generally in accordance with FIGS. 8 through 11.

FIG. 12 is a simplified schematic process flow 230 of a more complete description of the other process of making a semiconductor device package generally in accordance with FIGS. 8 through 11. The process flow 230 may involve providing a wafer 232 of semiconductor material, the wafer 232 including many semiconductor dice 120, for example, in a grid array across the wafer 232, as indicated at act 234. Individual semiconductor dice 120 may be singulated from one another using, for example, a dicing saw 236, as indicated at act 238. A strip 106 of lead frames 104 may be provided, and individual masses of dielectric material 114 may be placed on the respective die-attach pads 102 of the lead frames 104, as indicated at act 240 and described in greater detail in connection with FIG. 8. Individual semiconductor dice 120 may be placed on the respective masses of dielectric material 114 with the respective die-attach pads 102 located on sides of the masses of dielectric material 114 opposite the semiconductor dice 120, as also indicated at act 240 and described in greater detail in connection with FIG. 8. The masses of dielectric material 114 may be cured, such as, for example, by heating in a furnace 242, to secure the semiconductor dice 120 to the respective die-attach pads 102, as indicated at act 244.

Other individual masses of dielectric material 124 may be placed on the semiconductor dice 120 on a side opposite the die-attach pads 102, as indicated at act 246 and described in greater detail in connection with FIG. 9. Individual spacers 162 may be placed on the respective masses of dielectric material 124 with the masses of dielectric material 124 located between the spacers 162 and the semiconductor dice 120, as also indicated at act 246 and described in greater detail in connection with FIG. 9. The masses of dielectric material 124 may be cured, such as, for example, by heating in a furnace 248 (e.g., the same or a different furnace to the previously used furnace 242), to secure the spacers 162 to the respective semiconductor dice 120, as indicated at act 250.

After any curing, the individual first wire bonds 166 extending from respective bond pads 132 on the active surfaces 122 of each respective semiconductor die 120 to the associated spacer 162 may be formed. Individual second wire bonds 168 extending from each respective spacer 162 to associated lead fingers or die-attach pads 102 of the respective lead frames 104 may also be formed, as indicated at act 252, and described in greater detail in connection with FIGS. 10 and 11. Finally, encapsulation, final singulation, and any testing of completed semiconductor device packages may take place, as indicated at act 254 and described in greater detail in connection with FIGS. 10 and 11.

Figure 13:
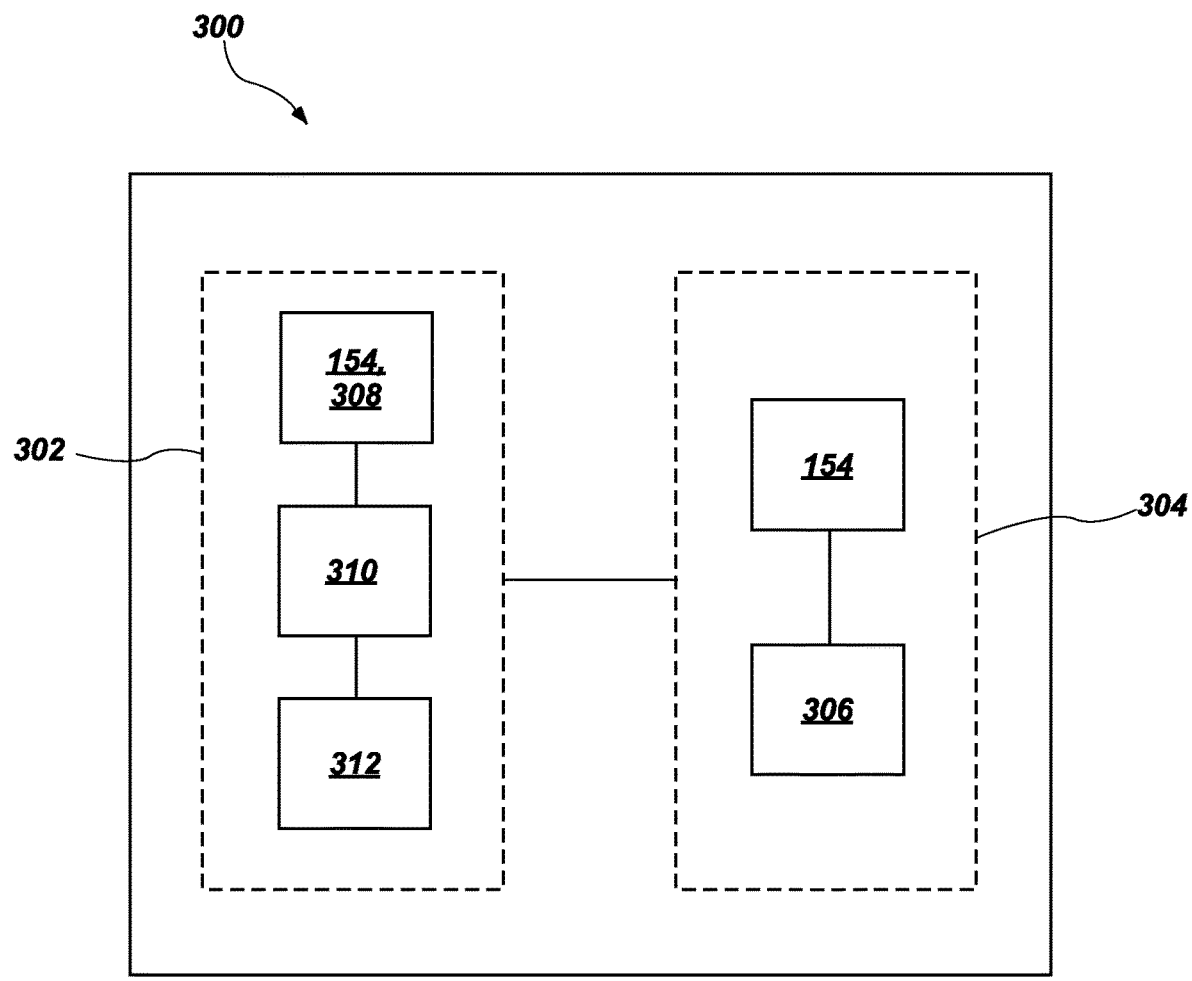
FIG. 13 is a schematic of a system including a semiconductor device package in accordance with this disclosure.

As will be apparent to those of ordinary skill in the art, embodiments of the disclosure provide advantages over conventional packaging schemes for strip testing of semiconductor device packages by avoiding the necessity for bond pad relocation, new tooling and leadframe design, while eliminating potential for wire crossing and shorting, and too close wire proximity and shorting. Further, embodiments support and facilitate fabrication of immediate engineering samples For example, FIG. 13 is a schematic of a system 300 including one or more semiconductor device packages 154 in accordance with this disclosure. For example, the system 300 may include a control unit 302 and a probe unit 304. The probe unit 304 may be include a sensor device 306 configured to generate an electrical signal representative of, and in response to, a detected physical phenomenon. The probe unit 304 may be a portable device, such as, for example, a handheld device. In some embodiments, the probe unit 304 may include a semiconductor device package 154 in accordance with this disclosure located within the probe unit 304, the semiconductor device package 154 configured to at least partially process the electrical signal locally within the probe unit 304. The probe unit 304 may be operatively connected to the control unit 302 (e.g., over a wired or wireless connection) and may send the raw, partially processed, or fully processed electrical signal to the control unit 302. In some embodiments, the control unit 302 may include another semiconductor device package 154 in accordance with this disclosure or a microprocessor 308, which may receive, decode, and/or further process the electrical signal. The control unit 302 may include a nontransitory memory device 310 configured to store the results of the fully processed electrical signal. The control unit 302 may optionally include an output device 312 (e.g., an electronic display, an audio speaker, a printer, etc.) configured to output the results of the fully processed electrical signal.

Additional, nonlimiting embodiments within the scope of this disclosure include the following:

Embodiment 1

A method of making and testing semiconductor device packages, comprising: positioning a dielectric material between a spacer comprising an electrically conductive material and at least some die-attach pads of lead frames supported in a strip; securing a semiconductor die to each spacer on a side of the respective spacer opposite the associated die-attach pad, an active surface of each semiconductor die located on a side of the semiconductor die opposite the respective spacer; forming a wire bond extending from a bond pad on the active surface of each respective semiconductor die to the associated spacer; forming another wire bond extending from each respective spacer to an associated lead finger; and encapsulating each semiconductor die and associated spacer, wire bonds, die-attach pad, and portions of lead fingers in a respective mass of an encapsulant material to form respective semiconductor device packages.

Embodiment 2

The method of Embodiment 1, further comprising: detaching the lead fingers from the strip; and contacting probes of a testing device to the lead fingers of each semiconductor device package and concurrently testing each semiconductor device package in the strip utilizing the probes.

Embodiment 3

The method of Embodiment 2, further comprising removing each semiconductor device package from the strip by detaching the die-attach pads from the strip after testing each semiconductor device package.

Embodiment 4

A semiconductor device package, comprising: a die-attach pad; a spacer comprising an electrically conductive material located on the die attach pad with a dielectric material between the spacer and the die attach pad; a semiconductor die supported on a side of the spacer opposite the die-attach pad, an active surface of the semiconductor die located on a side of the semiconductor die opposite the spacer; a wire bond extending from a bond pad on the active surface to the spacer; another wire bond extending from the spacer to a lead finger; and an encapsulant material encapsulating the semiconductor die, the spacer, the wire bond, the other wire bond, the die-attach pad, and a portion of the lead finger.

Embodiment 5

The semiconductor device package of Embodiment 4, wherein a thickness of the spacer as measured in a direction perpendicular to the active surface of the semiconductor die is about 15 thousandths of an inch or less.

Embodiment 6

The semiconductor device package of Embodiment 4 or Embodiment 5, wherein a footprint of the spacer as projected in a direction perpendicular to the active surface of the semiconductor die is greater than or equal to a footprint of the semiconductor die, as measured in the same direction.

Embodiment 7

The semiconductor device package of Embodiment 6, wherein the footprint of the spacer is less than a footprint of the die-attach pad, as measured in the same direction.

Embodiment 8

The semiconductor device package of any one of Embodiments 4 through 7, wherein the die-attach pad is free of operative connections to any lead finger of the semiconductor device package.

Embodiment 9

The semiconductor device package of any one of Embodiments 4 through 8, wherein the die-attach pad is free of electrical connections to the semiconductor die.

Embodiment 10

A semiconductor device package, comprising: a die-attach pad; a semiconductor die supported on the die-attach pad, an active surface of the semiconductor die located on a side of the semiconductor die opposite the die-attach pad; a spacer comprising an electrically conductive material located on the active surface of the semiconductor die with a dielectric material between the spacer and the semiconductor die; a wire bond extending from a bond pad on the active surface to the spacer; another wire bond extending from the spacer to a lead finger or the die-attach pad; and an encapsulant material encapsulating the semiconductor die, the spacer, the wire bond, the other wire bond, the die-attach pad, and a portion of each lead finger.

Embodiment 11

The semiconductor device package of Embodiment 10, wherein a footprint of the spacer as projected in a direction perpendicular to the active surface of the semiconductor die is less than a footprint of the semiconductor die, as measured in the same direction.

Embodiment 12

The semiconductor device package of Embodiment 10 or Embodiment 11, wherein the wire bond extends from a region with a first pitch of wire bonds toward a region with a second, lower pitch of wire bonds.

Embodiment 13

The semiconductor device package of any one of Embodiments 10 through 12, wherein the wire bond extends from proximate to a first lateral side of the semiconductor die and the other wire bond extends beyond a second, different lateral side of the semiconductor die to the lead finger or the die attach pad.

Embodiment 14

The semiconductor device package of any one of Embodiments 10 through 14, wherein the other wire bond extends to the die-attach pad and further comprising a third wire bond extending from the die attach pad to a lead finger.

Embodiment 15

The semiconductor device package of any one of Embodiments 10 through 14, wherein the other wire bond extends to the die-attach pad and further comprising: additional wire bonds extending from additional bond pads on the active surface to the spacer; and other additional wire bonds extending from the spacer to the die-attach pad.

Embodiment 16

A system, comprising: a control unit; and a probe unit operatively connected to the control unit; wherein at least one of the control unit and the probe unit comprises a semiconductor device package configured to at least partially process an electrical signal generated by the probe unit, the semiconductor device package comprising: a die-attach pad; a spacer comprising an electrically conductive material located on the die attach pad with a dielectric material between the spacer and the die attach pad; a semiconductor die supported on a side of the spacer opposite the die-attach pad, an active surface of the semiconductor die located on a side of the semiconductor die opposite the spacer; a wire bond extending from a bond pad on the active surface to the spacer; another wire bond extending from the spacer to a lead finger; and an encapsulant material encapsulating the semiconductor die, the spacer, the wire bond, the other wire bond, the die-attach pad, and a portion of the lead finger.

Embodiment 17

The system of Embodiment 16, wherein a footprint of the spacer as projected in a direction perpendicular to the active surface of the semiconductor die is greater than or equal to a footprint of the semiconductor die, as measured in the same direction.

Embodiment 18

A system, comprising: a control unit; and a probe unit operatively connected to the control unit; wherein at least one of the control unit and the probe unit comprises a semiconductor device package configured to at least partially process an electrical signal generated by the probe unit, the semiconductor device package comprising: a die-attach pad; a semiconductor die supported on the die-attach pad, an active surface of the semiconductor die located on a side of the semiconductor die opposite the die-attach pad; a spacer comprising an electrically conductive material located on the active surface of the semiconductor die with a dielectric material between the spacer and the die attach pad; a wire bond extending from a bond pad on the active surface to the spacer; another wire bond extending from the spacer to a lead finger or the die-attach pad; and an encapsulant material encapsulating the semiconductor die, the spacer, the wire bond, the other wire bond, the die-attach pad, and a portion of each lead finger.

Embodiment 19

A method of making a semiconductor device package, comprising: placing semiconductor die on a die-attach pad, an active surface of the semiconductor die located on a side of the semiconductor die opposite the die-attach pad; placing a spacer comprising an electrically conductive material on the active surface of the semiconductor die with a dielectric material between the spacer and the semiconductor die; forming a wire bond extending from a bond pad on the active surface of the semiconductor die to the spacer; forming another wire bond extending from the spacer to a lead finger; and encapsulating the semiconductor die, the spacer, the wire bond, the other wire bond, the die-attach pad, and a portions of the lead finger in an encapsulant material.

Embodiment 20

The method of Embodiment 19, wherein the die-attach pad and lead fingers are supported in a strip and further comprising: detaching the lead fingers from the strip; and contacting probes of a testing device to the lead fingers and testing the semiconductor die utilizing the probes.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A method of making and testing semiconductor device packages, comprising:
    positioning a dielectric material between a respective spacer comprising a plate of an electrically conductive material and at least some die-attach pads of lead frames supported in a strip;
    positioning a semiconductor die on each spacer on a side of a respective spacer opposite the associated die-attach pad, an active surface of each semiconductor die located on a side of the semiconductor die opposite the respective spacer;
    forming a first wire bond extending from a bond pad on the active surface of each respective semiconductor die, toward a first lateral side of the associated spacer, to the associated spacer;
    forming a second wire bond extending from each respective spacer, toward a second, different lateral side of each respective spacer, to an associated lead finger, wherein each second wire bond extending from the spacer to a respective lead finger extends toward the second different lateral side;
    forming a third wire bond extending from the semiconductor die to another, different lead finger; and
    encapsulating each respective semiconductor die and associated spacer, wire bonds, die-attach pad, and portions of lead fingers in a respective mass of an encapsulant material to form respective semiconductor device packages.

2. The method of claim 1, further comprising:
    detaching the lead fingers from the strip; and
    contacting probes of a testing device to the lead fingers of each semiconductor device package and concurrently testing each semiconductor device package in the strip utilizing the probes.

3. The method of claim 2, further comprising removing each semiconductor device package from the strip by detaching the respective die-attach pads from the strip after testing each semiconductor device package.

4. A semiconductor device package, comprising:
    a die-attach pad;
    a spacer comprising a plate of an electrically conductive material located on the die-attach pad with a dielectric material between the spacer and the die-attach pad;
    a semiconductor die supported on a side of the spacer opposite the die-attach pad, an active surface of the semiconductor die located on a side of the semiconductor die opposite the spacer;
    a first wire bond extending from a bond pad on the active surface, toward a first lateral side of the spacer, to the spacer;
    a second wire bond extending from the spacer, toward a second, different lateral side of the spacer, to a lead finger, wherein each second wire bond extending from the spacer to a respective lead finger extends toward the second, different lateral side;
    a third wire bond extending from the semiconductor die to another, different lead finger; and
    an encapsulant material encapsulating the semiconductor die, the spacer, the first wire bond, the second wire bond, the third wire bond, the die-attach pad, and a portion of each lead finger.

5. The semiconductor device package of claim 4, wherein a thickness of the spacer as measured in a direction perpendicular to the active surface of the semiconductor die is about 15 thousandths of an inch (0.0381 cm) or less.

6. The semiconductor device package of claim 4, wherein a footprint of the spacer as projected in a direction perpendicular to the active surface of the semiconductor die is greater than or equal to a footprint of the semiconductor die, as measured in the same direction.

7. The semiconductor device package of claim 6, wherein the footprint of the spacer is less than a footprint of the die-attach pad, as measured in the same direction.

8. The semiconductor device package of claim 4, wherein the die-attach pad is free of operative connections to any lead finger of the semiconductor device package.

9. The semiconductor device package of claim 4, wherein the die-attach pad is free of electrical connections to the semiconductor die.

10. A semiconductor device package, comprising:
a die-attach pad;
a semiconductor die supported on the die-attach pad, an active surface of the semiconductor die located on a side of the semiconductor die opposite the die-attach pad;
a spacer comprising an electrically conductive material located on the active surface of the semiconductor die with a dielectric material between the spacer and the semiconductor die;
a first wire bond extending from a bond pad proximate to a periphery of the semiconductor die on the active surface to the spacer;
a second wire bond extending from the spacer to a lead finger or the die-attach pad, wherein the bond pad from which the first wire bond extends is located proximate to a first lateral side of the spacer and wherein each second wire bond extending from the spacer to a respective lead finger extends toward a second, different lateral side of the spacer;
a third wire bond extending front the semiconductor die to another, different lead finger; and
an encapsulant material encapsulating the semiconductor die, the spacer, the first wire bond, the second wire bond, the third wire bond the die-attach pad, and a portion of each lead finger.

11. The semiconductor device package of claim 10, wherein a footprint of the spacer as projected in a direction perpendicular to the active surface of the semiconductor die is less than a footprint of the semiconductor die, as measured in the same direction.

12. The semiconductor device package of claim 10, wherein the first wire bond extends from a region with a first pitch of wire bonds toward a region with a second, lower pitch of wire bonds.

13. The semiconductor device package of claim 10, wherein the first wire bond extends from proximate to a first lateral side of the semiconductor die and the second wire bond extends beyond a second, different lateral side of the semiconductor die to the lead finger or the die-attach pad.

14. The semiconductor device package of claim 10, wherein the second wire bond extends to the die-attach pad and further comprising a fourth wire bond extending from the die-attach pad to another lead finger.

15. The semiconductor device package of claim 10, wherein the second wire bond extends to the die-attach pad and further comprising:
additional wire bonds extending from additional bond pads on the active surface to the spacer; and
other additional wire bonds extending from the spacer to the die-attach pad.

16. A system, comprising:
a control unit; and
a probe unit operatively connected to the control unit;
wherein at least one of the control unit and the probe unit comprises a semiconductor device package configured to at least partially process an electrical signal generated by the probe unit, the semiconductor device package comprising:
a die-attach pad;
a spacer comprising a plate of an electrically conductive material located on the die-attach pad with a dielectric material between the spacer and the die-attach pad;
a semiconductor die supported on a side of the spacer opposite the die-attach pad, an active surface of the semiconductor die located on a side of the semiconductor die opposite the spacer;
a first wire bond extending from a bond pad on the active surface, toward a first lateral side of the associated spacer, to the spacer;
a second wire bond extending from the spacer, toward a second, different lateral side of the spacer, to a lead finger, wherein each second wire bond extending from the spacer to a respective lead finger extends toward the second, different lateral side;
a third wire bond extending from the semiconductor die to another, different lead finger; and
an encapsulant material encapsulating the semiconductor die, the spacer, the first wire bond, the second wire bond, the third wire bond, the die-attach pad, and a portion of each lead finger.

17. The system of claim 16, wherein a footprint of the spacer as projected in a direction perpendicular to the active surface of the semiconductor die is greater than or equal to a footprint of the semiconductor die, as measured in the same direction.

18. A system, comprising:
a control unit; and
a probe unit operatively connected to the control unit;
wherein at least one of the control unit and the probe unit comprises a semiconductor device package configured to at least partially process an electrical signal generated by the probe unit, the semiconductor device package comprising:
a die-attach pad;
a semiconductor die supported on the die-attach pad, an active surface of the semiconductor die located on a side of the semiconductor die opposite the die-attach pad;
a spacer comprising an electrically conductive material located on the active surface of the semiconductor die with a dielectric material between the spacer and the semiconductor die;
a first wire bond extending from a bond pad proximate to a periphery of the semiconductor die on the active surface to the spacer;
a second wire bond extending from the spacer to a lead finger or the die-attach pad, wherein the bond pad from which the first wire bond extends is located proximate to a first lateral side of the spacer and wherein each second wire bond extending, from the spacer to a respective lead finger extends toward a second, different lateral side of the spacer;
a third wire bond extending from the semiconductor die to another, different lead finger, and
an encapsulant material encapsulating the semiconductor die, the spacer, the first wire bond, the second wire bond, the third wire bond the die-attach pad, and a portion of each lead finger.

19. A method of making a semiconductor device package, comprising:
- placing a semiconductor die on a die-attach pad, an active surface of the semiconductor die located on a side of the semiconductor die opposite the die-attach pad;
- placing a spacer comprising an electrically conductive material on the active surface of the semiconductor die with a dielectric material between the spacer and the semiconductor die;
- forming a first wire bond extending from a bond pad proximate to a periphery of the semiconductor die on the active surface of the semiconductor die to the spacer;
- forming a second wire bond extending from the spacer to a lead finger, wherein the bond pad from which the first wire bond extends is located proximate to a first lateral side of the spacer and wherein each second wire bond extending from the spacer to a respective lead finger extends toward a second, different lateral side of the spacer;
- forming a third wire bond extending from the semiconductor die to another, different lead finger; and
- encapsulating the semiconductor die, the spacer, the first wire bond, the second wire bond, the third wire bond, the die-attach pad, and a portion of each lead finger in an encapsulant material.

20. The method of claim 19, wherein the die-attach pad and lead fingers are supported in a strip and further comprising:
- detaching the lead fingers from the strip; and
- contacting probes of a testing device to the lead fingers and testing the semiconductor die utilizing the probes.

\* \* \* \* \*

UNITED STATES PATENT AND TRADEMARK OFFICE
CERTIFICATE OF CORRECTION

PATENT NO. : 11,145,574 B2
APPLICATION NO. : 16/235761
DATED : October 12, 2021
INVENTOR(S) : Mabutas et al.

It is certified that error appears in the above-identified patent and that said Letters Patent is hereby corrected as shown below:

In the Specification
| | | |
|---|---|---|
| Column 4, | Line 57, | change "spacer 122" to --spacer 112-- |
| Column 11, | Line 12, | change "die attach" to --die-attach-- |
| Column 11, | Line 13, | change "die attach" to --die-attach-- |
| Column 12, | Line 30, | change "die attach" to --die-attach-- |
| Column 12, | Line 37, | change "die attach" to --die-attach-- |
| Column 12, | Line 57, | change "die attach" to --die-attach-- |
| Column 12, | Line 58, | change "die attach" to --die-attach-- |
| Column 13, | Line 23, | change "die attach" to --die-attach-- |

In the Claims
| | | | |
|---|---|---|---|
| Claim 1, | Column 14, | Line 21, | change "second different lateral" to --second, different lateral-- |
| Claim 10, | Column 15, | Line 34, | change "extending front the" to --extending from the-- |
| Claim 10, | Column 15, | Line 38, | change "wire bond the" to --wire bond, the-- |
| Claim 18, | Column 16, | Line 59, | change "extending, from the" to --extending from the-- |

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*